United States Patent [19]
Jung et al.

[11] Patent Number: 5,715,851
[45] Date of Patent: Feb. 10, 1998

[54] WAFER CASSETTE AND CLEANING SYSTEM ADOPTING THE SAME

[75] Inventors: Jae-hyung Jung, Suwon; Young-hwan Yun, Seoul; Ho-seung Chang, Ansan, all of Rep. of Korea

[73] Assignee: Samsung Electronics Co., Ltd., Suwon, Rep. of Korea

[21] Appl. No.: 506,760

[22] Filed: Jul. 26, 1995

[30] Foreign Application Priority Data

Jul. 26, 1994 [KR] Rep. of Korea .................. 94-18076

[51] Int. Cl.$^6$ ............................................. B08B 3/10
[52] U.S. Cl. ..................... 134/155; 134/184; 134/186; 134/902
[58] Field of Search .......................... 134/184, 186, 134/155, 201, 147, 902

[56] References Cited

U.S. PATENT DOCUMENTS

| | | | |
|---|---|---|---|
| 4,618,263 | 10/1986 | McCord | 134/184 |
| 4,736,760 | 4/1988 | Coberly et al. | 134/184 |
| 4,804,007 | 2/1989 | Bran | 134/184 |
| 4,869,278 | 9/1989 | Bran | 134/186 |
| 5,365,960 | 11/1994 | Bran | 134/184 |

*Primary Examiner*—Frankie L. Stinson
*Attorney, Agent, or Firm*—Cushman Darby & Cushman Intellectual Property Group of Pillsbury Madison & Sutro LLP

[57] ABSTRACT

A wafer cassette through which a sonic wave is evenly transferred to a substrate in a quartz bath, and a cleaning system adopting the wafer cassette are provided. In the wafer cassette, a hole for evenly transferring the sonic wave to the substrate is formed. The cleaning system includes a vibration plate for generating a sonic wave, placed at the lowest portion of the cleaning system, a sink placed on the vibration plate, a quartz bath placed in the sink and spaced from the bottom of the sink, in which a wafer cassette is placed, a plurality of water supplies for supplying a cleaning solution, placed in the bottom of the quartz bath and a water drain for draining the cleaning solution overflown from the quartz bath, placed on the bottom of the sink, opposite to the water supplies, wherein the vibration plate is placed between the water drain and the water supplies. As a result, the oscillation frequency does not deviate from the setting value and air bubbles are not formed at the lower portion of the quartz bath, so that the irregular reflection of the sonic wave is restricted. Thus, the sonic wave is evenly transferred to the wafer, thereby enhancing the capability of removing the particles from the substrate.

6 Claims, 3 Drawing Sheets

WAFER CASSETTE AND CLEANING SYSTEM ADOPTING THE SAME

BACKGROUND OF THE INVENTION

The present invention relates to a cleaning system for a semiconductor device, and more particularly, to a wafer cassette and a cleaning system adopting the wafer cassette through which a sonic wave is evenly transferred to a semiconductor substrate in a quartz bath.

With the miniaturization of circuit patterns and the production of higher-density LSI devices, the yield and reliability of products have been influenced by microcontamination caused from the introduction of particles and/or metal impurities. Thus, concerns about purification in VLSI process have increased. Judging from the tendency of the contamination in producing the VLSI, any process can be the origin of the particles and various other forms of contamination. Therefore, to increase product yield, it is important to clean the silicon wafer surface for all process steps.

The particles or metal impurities are removed from wafers by a wet cleaning process. To completely remove contaminants of various kinds, such as metal impurities, organic contaminants and surface films (a natural oxide film and particles adhered thereto), the VLSI process adopts a cleaning system using many kinds of cleaning solutions. Also, the sonic wave is used for effectively removing the contaminants including particles on the substrate. Generally, an ultrasonic cleaning system adopting the 20–40 KHz band and a megasonic cleaning system adopting the 0.6–1 MHz band are in use. Specifically, since the megasonic cleaning system used for removing the particles, as a device for cleaning the surface of semiconductor wafer, adopts a higher frequency range, the sonic wave of the megasonic cleaning system has stronger directional properties than that of the ultrasonic cleaning system.

In the megasonic cleaning system, generally, a megasonic wave inducer is attached to the bottom of a quartz bath. A sonic wave having a high frequency, such as 0.6–1 MHz is produced using a megasonic wave inducer. Thus, cavitation is transferred to the substrate so that the particles on the wafer surface are removed.

FIG. 1 is a plan view illustrating a megasonic wave inducer of a conventional megasonic cleaning system, and the flow of cleaning solution therein.

First, in the megasonic cleaning system, a quartz bath 2 is placed in a predetermined region of a sink 1 and a vibration plate 3 is placed on a predetermined portion of the bottom of quartz bath 2. Also, quartz bath 2 includes a water supply 5 through which a cleaning solution such as distilled water is supplied thereto, and a water drain 9 for draining water overflown from quartz bath 2 is placed in sink 1. Reference numeral 7 represents the flow of distilled water. Distilled water supplied from water supply 5 fills quartz bath 2 and the water overflown therefrom drains from the megasonic cleaning system via water drain 9.

Next, the oscillation of the megasonic wave will be described in detail. A vibrator (not shown) for inducing the megasonic wave is placed on the bottom of vibration plate 3. The vibrator induces a high frequency sonic wave of 0.6–1 MHz. As a result, cavitation is transferred to the substrate so that the particles on the wafer surface are removed. Particularly, to restrict the heat generation on the vibration plate and remove the irregular reflection of the sonic wave and the air bubbles of the bottom of quartz bath, a constant amount of water should be supplied via water supply 5 placed between vibration plate 3 and quartz bath 2.

As shown in FIG. 1, in the conventional megasonic cleaning system, since water supply 5 is placed between vibration plate 3 and water drain 9, nearer the water drain, water cannot be regularly circulated within the megasonic cleaning system. If there is no smooth water circulation within the megasonic cleaning system, the inner temperature increases due to the heat generated from vibration plate 3, so that the oscillation frequency deviates from the setting value, e.g., by 950 KHz and air bubbles are formed on the bottom of quartz bath 2. As a result, the transfer of a sonic wave to the substrate is interrupted, and the amount of particles removed from the substrate is thereby decreased.

FIG. 2A is a diagram showing a conventional wafer cassette and FIG. 2B is a cross-section illustrating the flow of a sonic wave in the megasonic cleaning system shown in FIG. 1.

Referring to FIG. 2A, the wafer cassette will be described. The wafer cassette has the shape of a square pillar in which a plurality of semiconductor wafers can be loaded. The upper portions of a first wall 23 of the square pillar and a second wall 25 opposite the first wall are flat from their top to a predetermined portion and the remaining lower portions 27 thereof are slanted at a predetermined angle.

The flow of the sonic wave in the megasonic cleaning system adopting the wafer cassette shown in FIG. 2A will be described in detail with reference to FIG. 2B.

In FIG. 2B, reference numerals 1 and 2 represent a sink and a quartz bath which contain distilled water, respectively, reference numeral 13 represents a wafer cassette (a Teflon carrier) in which a wafer 17 is loaded, reference numeral 11 represents the vibrator oscillating the megasonic wave, reference numeral 15 shows the flow of the megasonic wave, and reference numerals 19 and 21 represent a quartz plate and wafer cassette supporting means, respectively, in quartz bath 2.

As shown in FIG. 2B, since the wafer cassette whose slanted lower portion 27 is just a wall is used, the megasonic wave cannot reach the "a" and "b" portions of FIG. 2B, so that the cleaning system cannot easily remove particles from the entire surface of the wafer.

FIGS. 3A and 3B are cross-sections illustrating quartz plate 19 and wafer cassette supporting means 21 which support the wafer cassette of FIG. 2A. Here, reference numeral 2 represents a quartz bath.

As shown in FIGS. 3A and 3B, in the conventional megasonic cleaning system adopting quartz plate 19, air bubbles 29 form on the bottom of quartz plate 19 supporting the wafer cassette in quartz bath 19. Since air bubbles 29 cause the irregular reflection of the megasonic wave and interrupt the transfer of sonic wave, the wafer cannot be evenly cleaned.

SUMMARY OF THE INVENTION

To solve the above problem, it is an object of the present invention to provide a wafer cassette through which a sonic wave is evenly transferred to a substrate in a quartz bath.

It is another object of the present invention to provide a cleaning system by which the particles of the wafer surface can be effectively removed using the wafer cassette.

To achieve the first object of the present invention, there is provided a wafer cassette for loading a plurality of semiconductor wafers therein, which has the shape of a square pillar having a slanted lower portion for supporting the wafer, wherein the slanted lower portion has at least one hole through which a sonic wave is evenly transferred to the wafer.

The hole occupies all or part of the area of the slanted lower portion.

To achieve the second object of the present invention, there is provided a cleaning system comprising a vibration plate for generating a sonic wave, placed at the lowest portion of the cleaning system, a sink placed on the vibration plate, a quartz bath placed in the sink and spaced from the bottom of the sink, in which a wafer cassette is placed, a plurality of water supplies for supplying a cleaning solution, placed in the bottom of the quartz bath and a water drain for draining the cleaning solution overflown from the quartz bath, placed on the bottom of the sink, opposite to the water supplies, wherein the vibration plate is placed between the water drain and the water supplies.

The sonic wave is a megasonic wave having a frequency band of 0.6–1 MHz. The cleaning system is further comprised of a supporting means for supporting the wafer cassette, placed at the bottom of the quartz bath.

According to the present invention, the oscillation frequency does not deviate from the setting value and air bubbles are not formed at the lower portion of the quartz bath, so that the irregular reflection of the sonic wave is restricted. Thus, the sonic wave is evenly transferred to the wafer, thereby enhancing the capability of removing particles from the substrate.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

Figure 4:
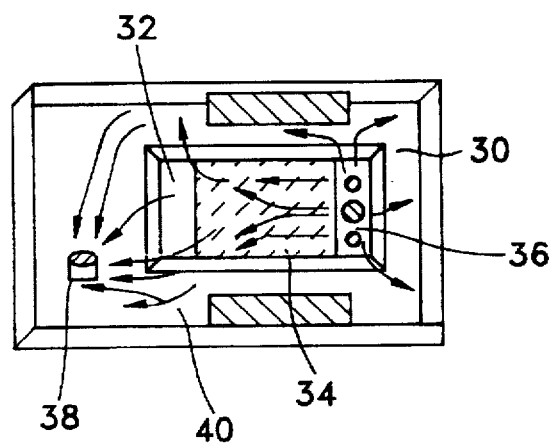
FIG. 4 is cross-section illustrating a megasonic wave inducer of the present invention, and the flow of cleaning solution therein.

Referring to FIG. 4, the structure of the megasonic cleaning system according to the present invention will be described. A quartz bath 32 is placed in a predetermined region of a sink 30 and a vibration plate 34 is placed on a predetermined portion of the bottom of quartz bath 32. Also, quartz bath 32 includes a water supply 36 through which a cleaning solution such as distilled water is supplied thereto, and a water drain 38 for draining the cleaning solution overflown from quartz bath 32 is placed in sink 30. Reference numeral 40 represents the flow of the cleaning solution. The cleaning solution supplied from water supply 36 fills quartz bath 32 and the cleaning solution overflown therefrom is drained from the megasonic cleaning system via water drain 38.

Next, the oscillation of the megasonic wave will be described in detail. A vibrator (not shown) for inducing the megasonic wave is placed on the bottom of vibration plate 34. The vibrator induces a high frequency sonic wave of 0.6–1 MHz. As a result, cavitation is transferred to the substrate so that the particles on the wafer surface are removed. Particularly, in order to restrict the heat generation on the vibration plate and remove the irregular reflection of the wave and the formation of an air bubbles on the bottom of quartz bath 32, a constant amount of water should be supplied via water supply 36 placed between vibration plate 34 and quartz bath 32.

As shown in FIG. 4, the megasonic cleaning system according to the present invention includes a plurality of water supplies 36 placed opposite (far from) water drain 38 in sink 30, so that water can be smoothly circulated within the megasonic cleaning system. If the water smoothly circulates, the generation of heat from vibration plate 34 is restricted, so that the oscillation frequency does not deviate from the setting value and the air bubbles are not formed at the lower portion of the quartz bath. As a result, the irregular reflection of the sonic wave is restricted, to thereby further remove the particles from the substrate.

Figure 6:
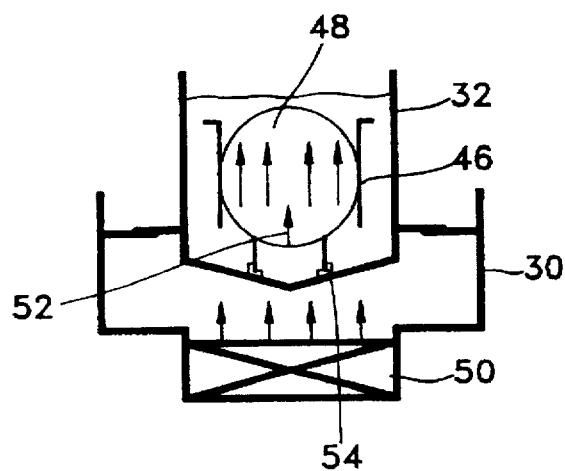
FIG. 6 is a cross-section illustrating the flow of a sonic wave in the megasonic cleaning system shown in FIG. 4.
Figure 5:
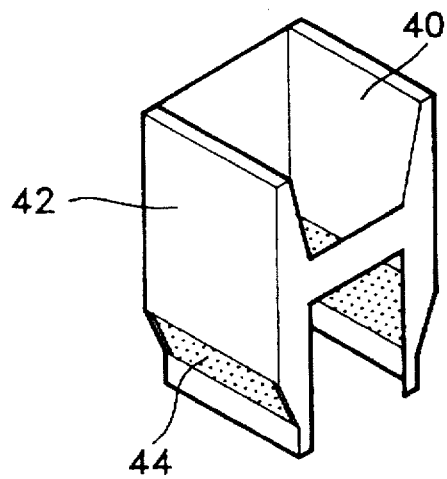
FIG. 5 is a diagram showing a wafer cassette according to the present invention.

FIG. 5 is a diagram showing a wafer cassette according to the present invention, and FIG. 6 is a cross-section illustrating the flow of sonic wave in the megasonic cleaning system shown in FIG. 4.

As shown in FIG. 5, the wafer cassette according to the present invention will be described. The wafer cassette has the shape of a square pillar in which a plurality of semiconductor wafers can be loaded. The upper portions of a first wall 40 of the square pillar and a second wall 42 opposite the first wall 40 are flat from their top to a predetermined portion and the remaining lower portions 44 are slanted at a predetermined angle and have holes.

Figure 1:
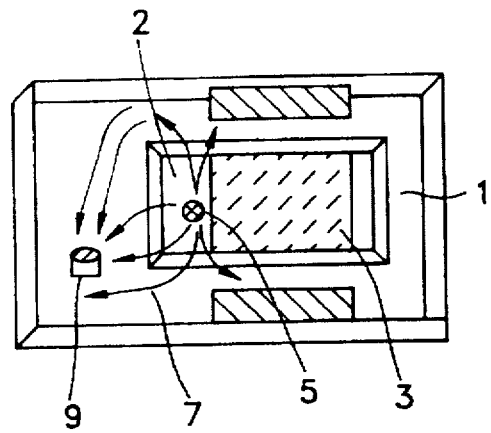
FIG. 1 is a plan view illustrating a megasonic wave inducer of a conventional megasonic cleaning system, and the flow of cleaning solution therein.
Figure 2A:
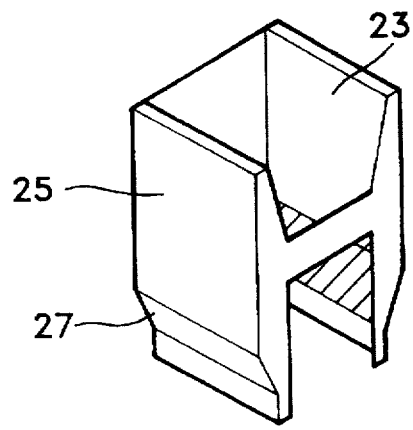
FIG. 2A is a diagram showing a conventional wafer cassette.
Figure 2B:
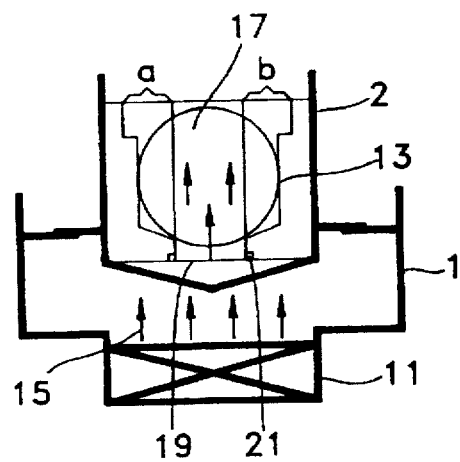
FIG. 2B is a cross-section illustrating the flow of a sonic wave within the megasonic cleaning system shown in FIG. 1.
Figure 3A:
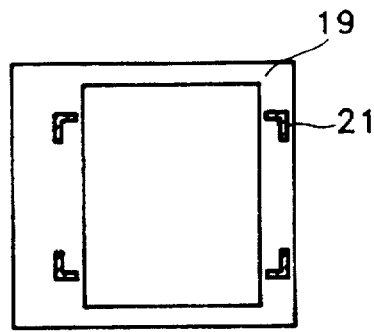
FIGS. 3A and 3B are cross-sections illustrating a quartz plate and wafer cassette supporting means of FIG. 2A.
Figure 3B:
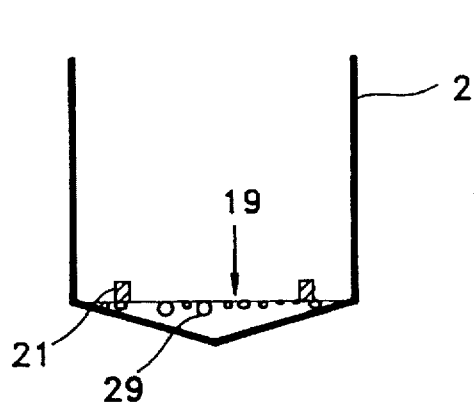

Specifically, the slanted lower portions 44 having holes function to support the wafers, in contrast with slanted lower portions 27 having no holes of the prior art (FIG. 2B). Thus, the sonic wave can be evenly transferred to the wafers loaded in the wafer cassette.

The flow of the sonic wave in the megasonic cleaning system adopting the wafer cassette shown in FIG. 5 will be described in detail with reference to FIG. 6.

In FIG. 6, reference numerals 30 and 32 represent a sink and a quartz bath which contain distilled water, respectively, a reference numeral 46 represents a wafer cassette (a Teflon carrier) in which a wafer 48 is loaded, reference numeral 50 represents the vibrator generating the megasonic wave, reference numeral 52 shows the flow of the megasonic wave, and reference numeral 54 represents wafer cassette supporting means for supporting wafer cassette 46 in quartz bath 32.

As shown in FIG. 6, since the wafer cassette whose slanted lower portion 44 of FIG. 5 has openings, the megasonic wave can be transferred to the entire wafer, including the "a" and "b" portions of FIG. 2B, so that the particles can be evenly removed from the entire surface of the wafer.

Figure 7A:
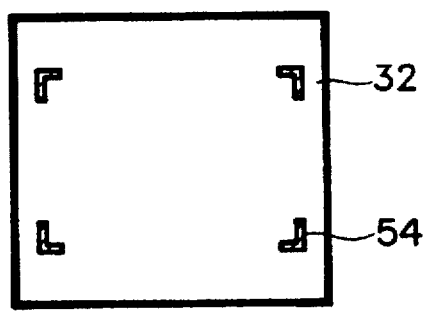
FIGS. 7A and 7B are diagrams illustrating wafer cassette supporting means of FIG. 5.
Figure 7B:
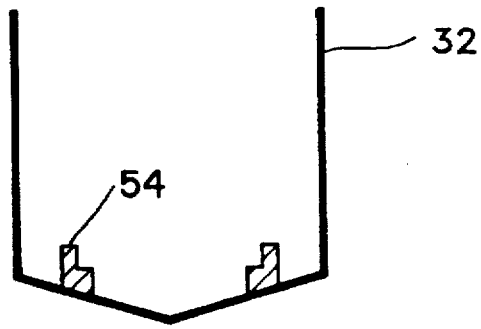

FIGS. 7A and 7B are cross-sections illustrating supporting means for support the wafer cassette of FIG. 5. Here, reference numeral 32 represents a quartz bath. As shown in FIGS. 7A and 7B, the megasonic cleaning system according to the present invention does not adopt the quartz plate for supporting the wafer cassette in quartz bath 32, so that the air bubbles causing the irregular reflection of the megasonic wave and interrupting the transfer of sonic wave are not generated, thereby evenly sonicating the wafer.

The megasonic cleaning system according to the present invention includes a plurality of water supplies 36 placed far from water drain 38 located in the sink, so that the cleaning solution can circulate smoothly. Also, since the lower portions of the wafer cassette have holes, the sonic wave can be evenly transferred to the wafer loaded in the cassette wafer. In addition, supporting means 54 of the present invention support the wafer cassette in the quartz bath, in contrast with the quartz plate used to support the wafer cassette in the conventional cleaning system, so that air bubbles are not formed thereon.

As described above, according to the present invention, the oscillation frequency is not deviated from the setting value and air bubbles are not formed at the lower portion of the quartz bath, so that the irregular reflection of the sonic wave is restricted. Thus, the sonic wave is evenly transferred to the wafer, thereby enhancing the capability of removing the particles from the substrate.

While the present invention has been illustrated and described with reference to specific embodiments, further modifications and improvements will occur to those skilled in the art and can be made without departing from the spirit and scope of the present invention as recited in the appended claims.

What is claimed is:

1. A cleaning system comprising:

a vibration plate for generating a sonic wave;

a sink placed on said vibration plate;

a quartz bath placed in said sink, a bottom surface of said quartz bath being spaced by a predetermined distance from the bottom of said sink;

a wafer cassette placed in said quartz bath;

a plurality of supplies for supplying a cleaning solution, placed in the bottom of said quartz bath; and a drain for draining said cleaning solution overflown from said quartz bath, placed on the bottom of said sink, said drain being placed opposite to said supplies, such that said vibration plate is between said drain and said supplies.

2. A cleaning system as claimed in claim 1, wherein said sonic wave is a megasonic wave having a frequency band of 0.6–1 MHz.

3. A cleaning system as claimed in claim 1, further comprising supporting means for supporting said wafer cassette, placed at the bottom of said quartz bath.

4. A cleaning system according to claim 1, wherein said wafer cassette comprises:

a square upper portion for loading a plurality of semiconductor wafers; and a slanted lower portion for supporting said wafers, said slanted lower portion having at least one hole through which said sonic wave is evenly transferred to said wafers.

5. A cleaning system according to claim 4, wherein said hole of said wafer cassette occupies substantially all of an area of said slanted lower portion.

6. A cleaning system according to claim 1, wherein said cleaning solution is water.

* * * * *